United States Patent
Choi et al.

(10) Patent No.: US 11,177,678 B2
(45) Date of Patent: Nov. 16, 2021

(54) WIRELESS POWER TRANSMISSION METHOD AND DEVICE IN WHICH RECTIFIER PERFORMANCE OF IOT SENSOR IS TAKEN INTO CONSIDERATION

(71) Applicant: Korea Advanced Institute of Science and Technology, Daejeon (KR)

(72) Inventors: JunKyun Choi, Daejeon (KR); Jaeseob Han, Daejeon (KR); Sangdon Park, Daejeon (KR)

(73) Assignee: Korea Advanced Institute of Science and Technology

( * ) Notice: Subject to any disclaimer, the term of this patent is extended or adjusted under 35 U.S.C. 154(b) by 148 days.

(21) Appl. No.: 16/550,425

(22) Filed: Aug. 26, 2019

(65) Prior Publication Data

US 2020/0161873 A1    May 21, 2020

(30) Foreign Application Priority Data

Nov. 16, 2018  (KR) .................. 10-2018-0141448
Jan. 18, 2019   (KR) .................. 10-2019-0006887

(51) Int. Cl.
| | |
|---|---|
| *H02J 7/00* | (2006.01) |
| *H02J 50/10* | (2016.01) |
| *H02J 50/80* | (2016.01) |
| *G01R 31/36* | (2020.01) |
| *H02J 50/40* | (2016.01) |
| *H02M 7/12* | (2006.01) |
| *H02J 7/02* | (2016.01) |

(52) U.S. Cl.
CPC .......... *H02J 7/007* (2013.01); *G01R 31/3648* (2013.01); *H02J 7/025* (2013.01); *H02J 50/10* (2016.02); *H02J 50/40* (2016.02); *H02J 50/80* (2016.02); *H02M 7/12* (2013.01)

(58) Field of Classification Search
None
See application file for complete search history.

(56) References Cited

U.S. PATENT DOCUMENTS

| | | | |
|---|---|---|---|
| 2017/0288737 A1* | 10/2017 | Lee ................... | H02J 13/00 |
| 2018/0138758 A1* | 5/2018 | Jung .................. | H02J 50/90 |
| 2018/0191206 A1* | 7/2018 | Bronson ............. | H02J 50/80 |
| 2019/0052116 A1* | 2/2019 | Bae ................... | H02J 7/0042 |
| 2019/0245385 A1* | 8/2019 | Chandrakasan ..... | H02J 50/80 |
| 2020/0036231 A1* | 1/2020 | Nakao ............... | H02J 50/80 |

\* cited by examiner

*Primary Examiner* — Jared Fureman
*Assistant Examiner* — Joel Barnett
(74) *Attorney, Agent, or Firm* — Burns & Levinson LLP; Joseph M. Maraia (57) ABSTRACT

Disclosed herein are a wireless power transmission method and device in which rectifier performance of an Internet of things (IOT) sensor is taken into consideration. The method and device may be configured to identify rectifier performance of each of a plurality of IOT sensors, determine power to be transmitted to each of the IOT sensors based on a value for enabling power, output by the rectifier, to reach a predetermined maximum value based on the rectifier performance, and transmit the power to each of the IOT sensors in the form of electromagnetic waves.

8 Claims, 9 Drawing Sheets

WIRELESS POWER TRANSMISSION METHOD AND DEVICE IN WHICH RECTIFIER PERFORMANCE OF IOT SENSOR IS TAKEN INTO CONSIDERATION

CROSS REFERENCE TO RELATED APPLICATION

This application is based on and claims priority under 35 U.S.C. 119 to Korean Patent Application Nos. 10-2018-0141448, filed on Nov. 16, 2018 and 10-2019-0006887, filed on Jan. 18, 2019, in the Korean Intellectual Property Office, the disclosures of which is herein incorporated by reference in their entireties.

BACKGROUND OF THE INVENTION

1. Technical Field

Various embodiments relate to a wireless power transmission method and device in which rectifier performance of an Internet of things (IOT) sensor is taken into consideration.

2. Description of the Related Art

With the development of the technology, there is proposed a wireless power charging system for wirelessly charging an electronic device. In the wireless power charging system, the electronic device includes a wireless power transmission device and a wireless power reception device. The wireless power transmission device can wirelessly transmit power, and the wireless power reception device can wirelessly receive power. In this case, the wireless power transmission device and the wireless power reception device may operate based on a wireless charging method, such as an electromagnetic induction method or a magnetic resonance method. That is, power may be supplied from the wireless power transmission device to the wireless power reception device through an electromagnetic field formed between the primary coil of the wireless power transmission device and the secondary coil of the wireless power reception device.

SUMMARY OF THE INVENTION

However, in order for power to be supplied from the wireless power transmission device to the wireless power reception device in the wireless power charging system, there is a problem in that the distance between the wireless power transmission device and the wireless power reception device must be short. For example, if the wireless power reception device is implemented as an IOT sensor, power is not supplied from the wireless power transmission device to the wireless power reception device if the distance between the wireless power transmission device and the wireless power reception device exceeds a predetermined distance.

In various embodiments, a method for a wireless power transmission device to transmit power wirelessly may include identifying rectifier performance of at least one wireless power reception device, determining power to be transmitted to the wireless power reception device based on the rectifier performance, and transmitting the power to the wireless power reception device in an electromagnetic wave form.

In various embodiments, a wireless power transmission device includes a power transmitter having a plurality of antennas and a processor connected to the power transmitter. The processor may be configured to identify rectifier performance of at least one wireless power reception device, determine power to be transmitted to the wireless power reception device based on the rectifier performance, and control the power transmitter to transmit the power to the wireless power reception device in an electromagnetic wave form through the antennas.

In various embodiments, a method for a wireless power transmission device to transmit power wirelessly includes identifying rectifier performance of each of a plurality of Internet of things (IOT) sensors, determining power to be transmitted to each of the IOT sensors based on the rectifier performance, and transmitting the power to each of the IOT sensors in an electromagnetic wave form. The determining of the power may include determining the power based on a value enabling power, output by the rectifier, to reach a predetermined maximum value.

DETAILED DESCRIPTION

Hereinafter, various embodiments of this document are described with reference to the accompanying drawings.

The embodiments of this document and the terms used in the embodiments are not intended to limit the technology described in this document to a specific embodiment, but should be construed as including various changes, equivalents and/or alternatives of a corresponding embodiment. Regarding the description of the drawings, similar reference numerals may be used in similar elements. An expression of the singular number may include an expression of the plural number unless clearly defined otherwise in the context. In this document, an expression, such as "A or B", "at least one of A or/and B", "A, B or C" or "at least one of A, B and/or C", may include all of possible combinations of listed items together. Expressions, such as "a first," "a second," "the first" and "the second", may modify corresponding elements regardless of the sequence and/or importance, and are used to only distinguish one element from the other element and do not limit corresponding elements. When it is described that one (e.g., first) element is "(operatively or communicatively) connected to" or "coupled with" the other (e.g., second) element, one element may be directly connected to the other element or may be connected to the other element through another element (e.g., third element).

The "module" used in this document may include a unit configured with hardware, software or firmware and may be interchangeably used with a term, such as logic, a logical block, a part or a circuit. The module may be an integrated part, a minimum unit to perform one or more functions, or a part thereof. For example, the module may be configured with an application-specific integrated circuit (ASIC).

Figure 1:
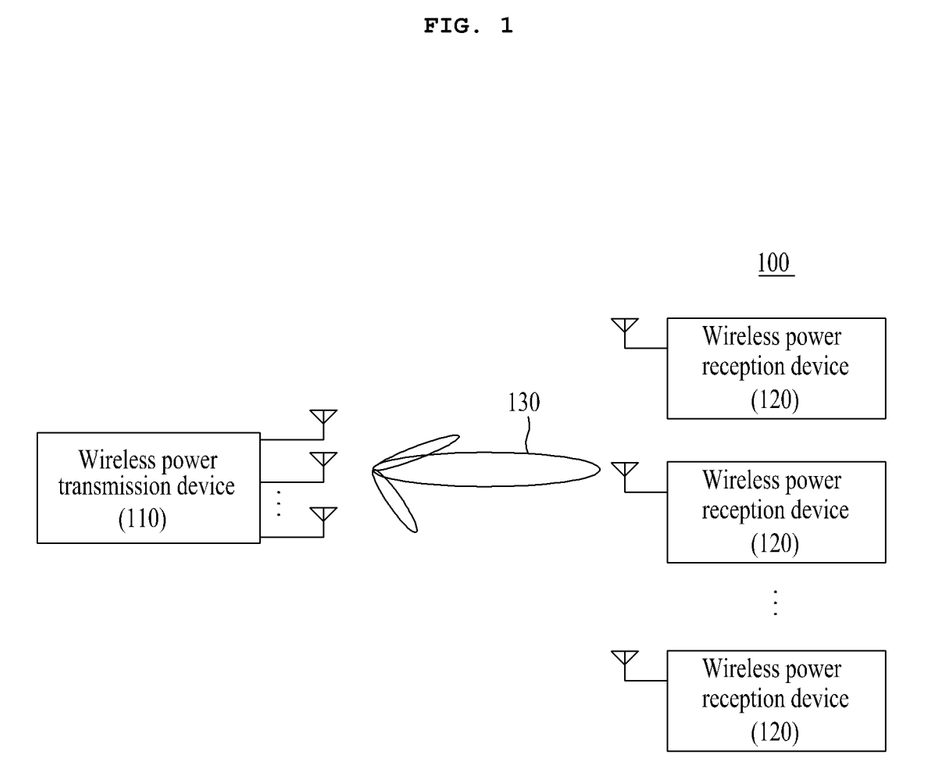
FIG. 1 is a diagram showing a wireless power charging system according to various embodiments.
Figure 2:
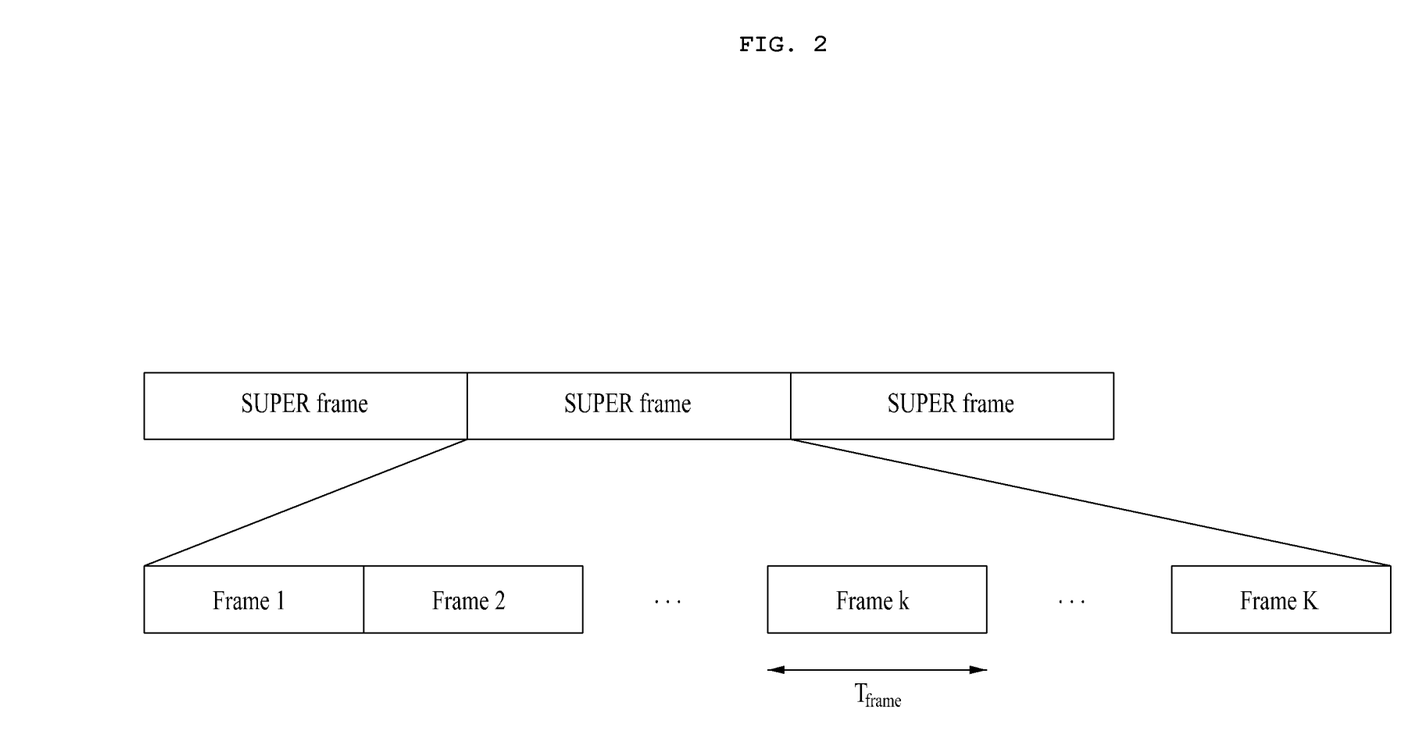
FIG. 2 is a diagram showing the super frame structure of the wireless power charging system according to various embodiments.

FIG. 1 is a diagram showing a wireless power charging system according to various embodiments. FIG. 2 is a diagram showing the super frame structure of the wireless power charging system according to various embodiments.

Referring to FIG. 1, the wireless power charging system 100 according to various embodiments may include a wireless power transmission device 110 and a plurality of wireless power reception devices 120.

The wireless power transmission device 110 may wirelessly transmit power. In this case, the wireless power transmission device 110 may transmit power based on a radio wave radiation method. That is, the wireless power transmission device 110 may transmit power using electromagnetic waves. To this end, the wireless power transmission device 110 is connected to a power source (not shown), and may convert AC power, supplied from the power source, into electromagnetic waves and transmit the electromagnetic waves.

The wireless power reception devices 120 may wirelessly receive power. In this case, the wireless power reception devices 120 may receive power based on a radio wave radiation method. That is, the wireless power reception devices 120 may receive power using electromagnetic waves. To this end, the wireless power reception devices 120 may receive electromagnetic waves and convert them into AC power. Furthermore, the wireless power reception device 120 includes a rectifier (not shown), and may convert AC power into DC power using the rectifier. The wireless power reception device 120 may have mobility. Alternatively, the wireless power reception device 120 may be fixedly installed at a predetermined location. For example, the wireless power reception device 120 may include an Internet of things (IOT) sensor.

According to various embodiments, the wireless power transmission device 110 may determine power to be transmitted to the wireless power reception device 120 based on rectifier performance of the wireless power reception device 120. In this case, the wireless power transmission device 110 may determine power to be transmitted to each of the wireless power reception devices 120 based on a value that enables power, output by the rectifier of the wireless power reception device 120, to reach a predetermined maximum value.

According to various embodiments, the wireless power transmission device 110 may transmit power to the wireless power reception devices 120 based on an orthogonal frequency division multiplexing (OFDM) scheme. As shown in FIG. 2, the wireless power transmission device 110 may transmit power to the wireless power reception devices 120 using super frames contiguous in a time domain. In this case, each of the super frames may have a structure in which K frames that are temporally divided are contiguous. In this case, each frame may have each frame size (Tframe). The wireless power transmission device 110 may allocate frames to the wireless power reception devices 120, respectively, through the scheduling of each super frame. For example, the wireless power transmission device 110 may assign priority to the wireless power reception device 120 based on the charging state of the wireless power reception device 120, and may allocate frames to the wireless power reception devices 120, respectively, based on the priority. Furthermore, the wireless power transmission device 110 may transmit power to each wireless power reception device 120 through the frame allocated to the wireless power reception device 120. Accordingly, each of the wireless power reception devices 120 can receiver power through each allocated frame.

According to various embodiments, the wireless power transmission device 110 may transmit power through energy beamforming. The wireless power transmission device 110 includes a plurality of antennas, and may form beams 130 for transmitting power using the antennas. In this case, the wireless power transmission device 110 may transmit power to each wireless power reception device 120 by forming the beam 130 having directivity toward each of the wireless power reception devices 120. To this end, the wireless power transmission device 110 may form a beam 130 for transmitting power to each wireless power reception device 120 using a weight vector W determined based on a radio channel formed between the wireless power transmission device 110 and each wireless power reception device 120, as in Equation 1. Accordingly, the wireless power reception device 120 includes at least one antenna, and may receive power from the beam 130, formed by the wireless power transmission device 110, through the antenna. For example, the relation between power received by the wireless power reception device 120 and power transmitted by the wireless power transmission device 110 may be represented like Equation 2.

$$w_k = v_{max}(h_k h_k^H)$$ [Equation 1]

In Equation 1, $w_k$ may indicate a weight vector for a k-th wireless power reception device 120. $v_{max}(h_k h_k^H)$ may indicate an Eigen vector corresponding to a maximum Eigen value $\lambda_k$ of a channel matrix $h_k h_k^H$ for the k-th wireless power reception device 120.

$$P_{r,k} = \lambda_k P_{t,k}$$ [Equation 2]

In Equation 2, $P_{t,k}$ may indicate power transmitted from the wireless power transmission device 110 to a k-th wireless power reception device 120. $P_{r,k}$ may indicate power received by the k-th wireless power reception device 120. $\lambda_k$ may indicate a maximum Eigen value of a channel matrix $h_k h_k^H$ for the k-th wireless power reception device 120.

Figure 3:
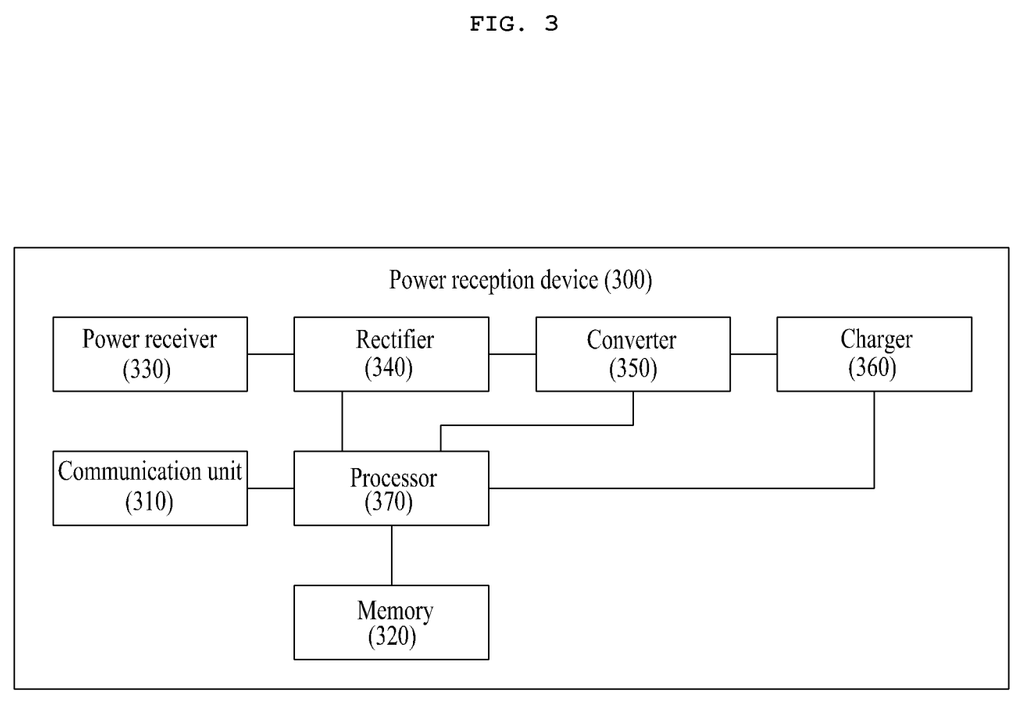
FIG. 3 is a diagram showing a wireless power reception device according to various embodiments.

FIG. 3 is a diagram showing a wireless power reception device according to various embodiments.

Referring to FIG. 3, the wireless power reception device (e.g., the wireless power reception device 120 of FIG. 1) 300 according to various embodiments may include a communication unit 310, a memory 320, a power receiver 330, a rectifier 340, a converter 350, a charger 360 and a processor 370.

The communication unit 310 may perform communication for the wireless power reception device 300. In this case, the communication unit 310 may communicate with an external device (not shown) using various communication methods. The communication unit 310 may perform at least any one of wireless communication or wired communication. To this end, the communication unit 310 may access at least any one of a mobile communication network or a data communication network. Alternatively, the communication unit 310 may perform short-distance communication. For example, the external device may include at least any one of a base station, a server or a wireless power transmission device (e.g., the wireless power transmission device 110 of FIG. 1). Furthermore, the communication methods may include long term evolution (LTE), wideband code division multiple access (WCDMA), a global system for mobile communications (GSM), wireless fidelity (WiFi), Bluetooth, and near field communications (NFC).

The memory 320 may store the programs of the wireless power reception device 300. Furthermore, the memory 320 may store data generated while the wireless power reception device 300 executes the programs. For example, the memory 320 may store information related to the rectifier 340.

The power receiver 330 of the wireless power reception device 300 may wirelessly receive power. In this case, the power receiver 330 may receive power based on a radio wave radiation method. That is, the power receiver 330 may receive power using electromagnetic waves. To this end, the power receiver 330 includes at least one antenna, and may receive electromagnetic waves through the antenna. In this case, the power receiver 330 may convert electromagnetic waves into AC power.

The rectifier 340 may rectify power received through the power receiver 330 of the wireless power reception device 300. In this case, the rectifier 340 may convert AC power into DC power. In this case, power output by the rectifier 340 may be determined based on power input to the rectifier 340, depending on performance of the rectifier 340. For example, if the wireless power reception device 300 is an Internet of things (IOT) sensor, the rectifier 340 may operate in a 900 MHz band. For example, assuming that performance of the rectifier 340 is a non-linear model, the relation between power input to the rectifier 340 and power output by the rectifier 340 may be represented like Equation 3.

$$r(x) = a_k \log(1 + b_k x) \qquad [\text{Equation 3}]$$

In Equation 3, x may indicate power input to the rectifier 340. r(x) may indicate power output by the rectifier 340. $a_k$ and $b_k$ may indicate the variables of a proximate function according to performance of the rectifier 340.

The converter 350 may convert power output by the rectifier 340 of the wireless power reception device 300. In this case, the converter 350 may adjust a voltage of DC power. The converter 350 may adjust a voltage of DC power in accordance with a voltage of a battery (not shown).

The charger 360 may charge the battery with power. In this case, the charger 360 may include the battery therein, and may provide power to an external battery.

The processor 370 may control an overall operation of the wireless power reception device 300. In this case, the processor 370 may perform various functions. To this end, the processor 370 may control the elements of the wireless power reception device 300. Furthermore, the processor 370 may receive an instruction or data from the elements of the wireless power reception device 300, and may process the instruction or data.

The processor 370 may share various types of information with the wireless power transmission device 300 using the communication unit 310. Furthermore, the processor 370 may wirelessly receive power through the power receiver 330. In this case, the processor 370 may receive power from a beam (e.g., the beam 130 of FIG. 1), formed to have directivity toward the wireless power reception device 300 by a wireless power transmission device (e.g., the wireless power transmission device 110 of FIG. 1), through a channel formed between a wireless power transmission device (e.g., the wireless power transmission device 110 of FIG. 1) and the wireless power reception device 300. In this case, the processor 370 may receive power based on the OFDM scheme. Furthermore, the processor 370 may process power using at least one of the rectifier 340, the converter 350 or the charger 360.

Figure 4:
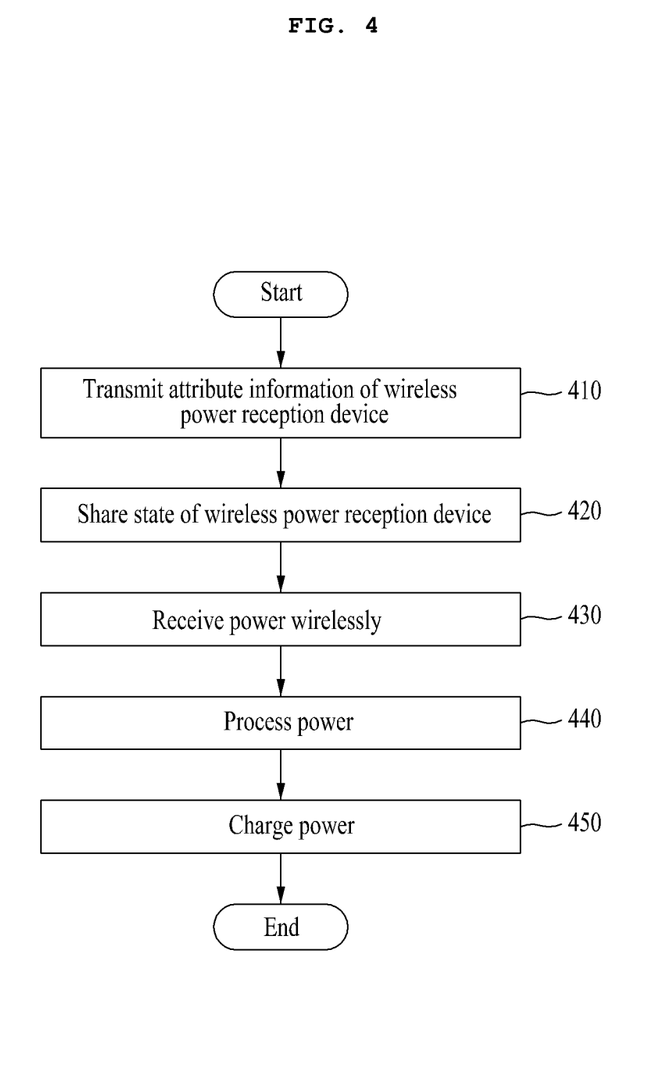
FIG. 4 is a diagram showing a wireless power reception method according to various embodiments.

FIG. 4 is a diagram showing a wireless power reception method according to various embodiments.

Referring to FIG. 4, at operation 410, the wireless power reception device 300 may transmit attribute information of the wireless power reception device 300 to a wireless power transmission device (e.g., the wireless power transmission device 110 of FIG. 1). In this case, the processor 370 may transmit the attribute information of the wireless power reception device 300 through the communication unit 310. The attribute information may include at least any one of information related to the rectifier 340 or information related to a radio channel formed between a wireless power transmission device (e.g., the wireless power transmission device 110 of FIG. 1) and the wireless power reception device 300. For example, the information related to the rectifier 340 may include at least one of rectification performance information or rectification range information. The information related to the radio channel may include information on the state of the radio channel.

At operation 420, the wireless power reception device 300 may share the state of the wireless power reception device 300 with a wireless power transmission device (e.g., the wireless power transmission device 110 of FIG. 1). In this case, the processor 370 may transmit information related to the state of the wireless power reception device 300 through the communication unit 310. In this case, the information related to the state of the wireless power reception device 300 may include at least any one of information on the charging state of the wireless power reception device 300 or information related to a radio channel formed between a wireless power transmission device (e.g., the wireless power transmission device 110 of FIG. 1) and the wireless power reception device 300. For example, the information on the charging state of the wireless power reception device 300 may include the amount of remaining battery power. The information related to a radio channel may include information on the state of the radio channel.

At operation 430, the wireless power reception device 300 may wirelessly receive power. In this case, the processor 370 may receive power through the power receiver 330. In this case, the power receiver 330 may receive power through a channel formed between a wireless power transmission device (e.g., the wireless power transmission device 110 of FIG. 1) and the wireless power reception device 300. That is, the power receiver 330 may receive power from a beam (e.g., the beam 130 of FIG. 1), formed to have directivity facing the wireless power reception device 300 by a wireless power transmission device (e.g., the wireless power transmission device 110 of FIG. 1), through the antenna. Furthermore, the processor 370 may receive power based on the OFDM scheme.

According to an embodiment, the processor 370 may receive power through the power receiver 330 based on scheduling information received from a wireless power transmission device (e.g., the wireless power transmission device 110 of FIG. 1). The scheduling information is generated when a power transmission device (e.g., the wireless power transmission device 110 of FIG. 1) performs scheduling on a super frame, and may include information related to a frame allocated to the wireless power reception device 120. That is, the processor 370 may receive scheduling information from a wireless power transmission device (e.g., the wireless power transmission device 110 of FIG. 1), and may identify a frame, allocated to the wireless power reception device 120, in the scheduling information. In this case, the processor 370 may receive the scheduling information through the communication unit 310. Furthermore, the processor 370 may receive power by activating the power receiver 330 in a frame allocated to the wireless power reception device 120.

At operation 440, the wireless power reception device 300 may process power. In this case, the processor 370 may convert AC power into DC power using the rectifier 340. In this case, power output by the rectifier 340 may be determined based on power input to the rectifier 340, depending on performance of the rectifier 340. Furthermore, the processor 370 may adjust a voltage of the DC power using the converter 350. In this case, the converter 350 may adjust a voltage of the DC power in accordance with a voltage of a battery (not shown).

At operation 450, the wireless power reception device 300 may be charged with power. In this case, the processor 370 may charge the battery with power using the charger 360. In this case, the charger 360 may include the battery therein and may provide power to an external battery.

Figure 5:
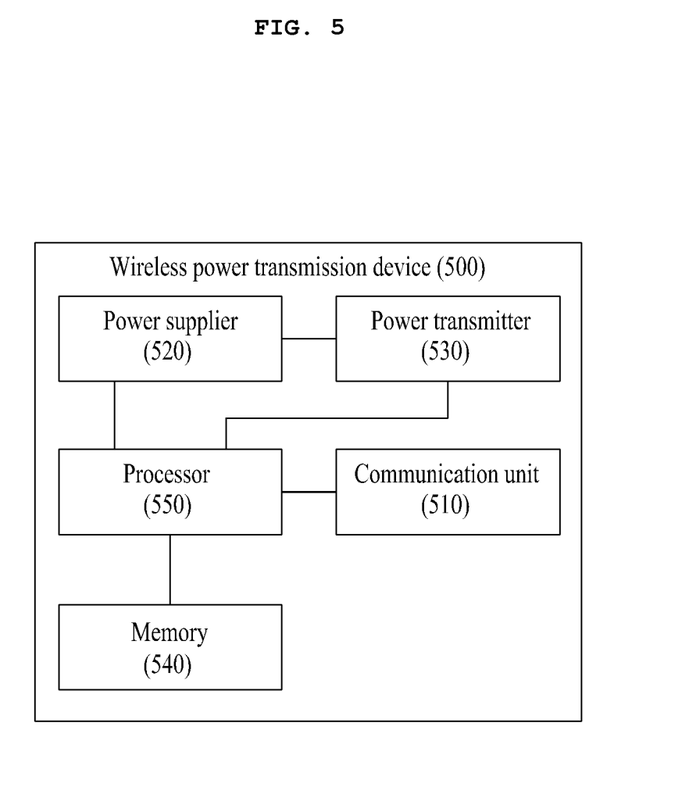
FIG. 5 is a diagram showing a wireless power transmission device according to various embodiments.
Figure 6:
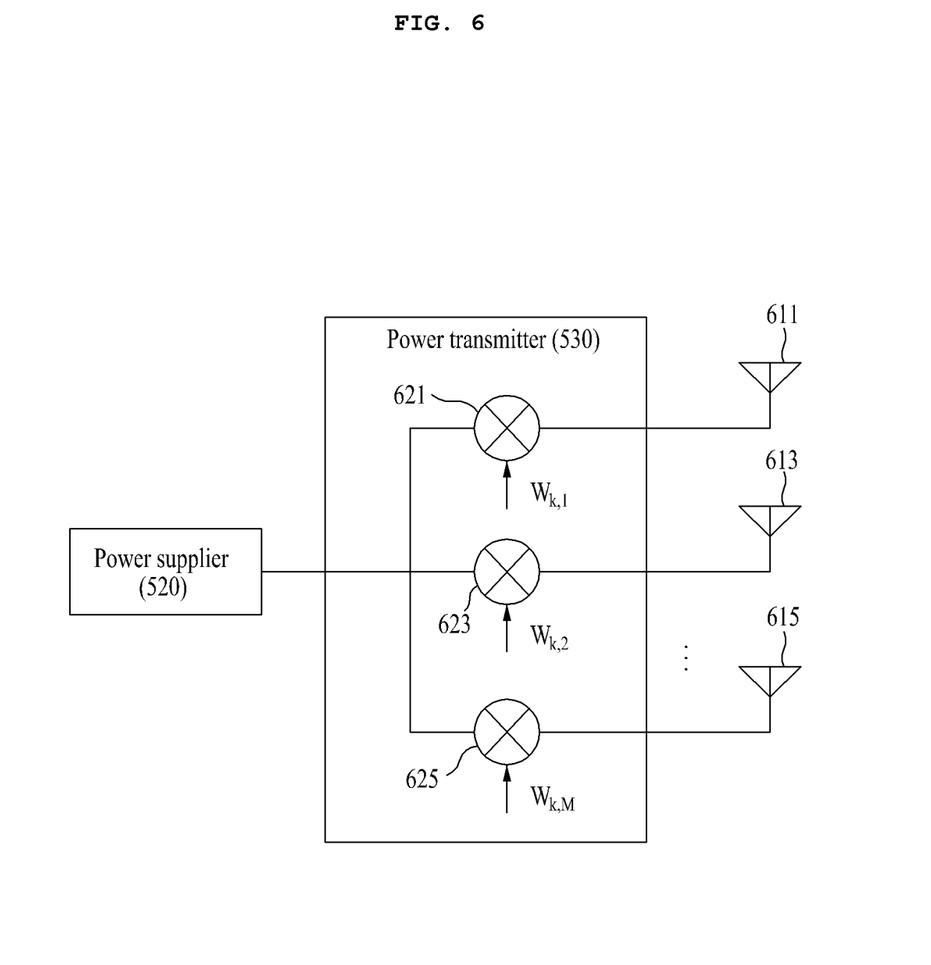
FIG. 6 is a diagram showing a power transmitter of FIG. 5.
Figure 7:
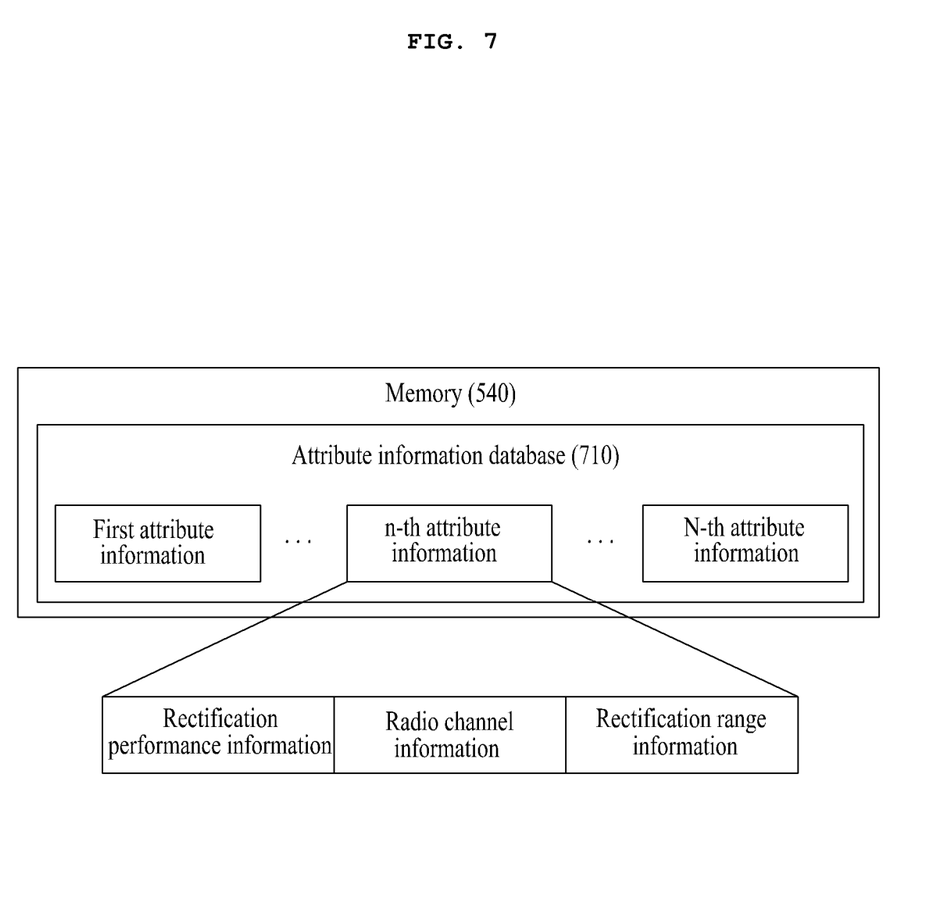
FIG. 7 is a diagram showing a memory of FIG. 5.

FIG. 5 is a diagram showing a wireless power transmission device according to various embodiments. FIG. 6 is a diagram showing the power transmitter of FIG. 5. FIG. 7 is a diagram showing the memory of FIG. 5.

Referring to FIG. 5, a wireless power transmission device (e.g., the wireless power transmission device 110 of FIG. 1) 500 according to various embodiments may include a communication unit 510, a power supplier 520, a power transmitter 530, a memory 540 and a processor 550.

The communication unit 510 of the wireless power transmission device 500 may perform communication. In this case, the communication unit 510 may communicate with an external device (not shown) using various communication methods. In this case, the communication unit 510 may perform at least any one of wireless communication or wired communication. To this end, the communication unit 510 may access at least any one of a mobile communication network or a data communication network. Alternatively, the communication unit 510 may perform short-distance communication. For example, the external device may include at least any one of a base station, a server or a wireless power reception device (e.g., the wireless power reception device 120 of FIG. 1, the wireless power reception device 300 of FIG. 3). Furthermore, communication methods may include LTE, WCDMA, GSM, WiFi, Bluetooth and NFC.

The power supplier 520 may supply power to the wireless power transmission device 500. To this end, the power supplier 520 is connected to a power source (not shown) and may supply power from the power source. In this case, the power supplier 520 may supply AC power.

The power transmitter 530 of the wireless power transmission device 500 may wirelessly transmit power. In this case, the power transmitter 530 may transmit power based on a radio wave radiation method. That is, the power transmitter 530 may transmit power using electromagnetic waves. In this case, the power transmitter 530 may convert AC power, supplied from the power supplier 520, into electromagnetic waves, and may transmit the electromagnetic waves. Furthermore, the power transmitter 530 may transmit power through energy beamforming. To this end, the power transmitter 530 includes a plurality of antennas, and may form beams (e.g., the beams 130 of FIG. 1) for transmitting power using the antennas. According to an embodiment, as shown in FIG. 6, the power transmitter 530 may include M antennas 611, 613, . . . , 615, and M multipliers 621, 623, . . . , 625 connected to the antennas 611, 613, 615 respectively. For example, the power transmitter 530 may form a beam (e.g., the beam 130 of FIG. 1) for a k-th wireless power reception device (e.g., the wireless power reception device 120 of FIG. 1, the wireless power reception device 300 of FIG. 3) by applying the weight components $W_{k,1}$, $W_{k,2}$, . . . , $W_{k,M}$ of a weight vector $w_k$, determined based on a radio channel formed between the wireless power transmission device 500 and the k-th wireless power reception device (e.g., the wireless power reception device 120 of FIG. 1, the wireless power reception device 300 of FIG. 3), to the multipliers 621, 623, . . . , 625, respectively.

The memory 540 may store the programs of the wireless power transmission device 500. Furthermore, the memory 540 may store data generated while programs are executed in the wireless power transmission device 500. For example, as shown in FIG. 7, the memory 540 may include an attribute information database 710. The attribute information database 710 may store attribute information of N wireless power reception devices (e.g., the wireless power reception devices 120 of FIG. 1, the wireless power reception devices 300 of FIG. 3). The attribute information may include at least any one of information related to the rectifier (e.g., the rectifier 340 of FIG. 3) of each wireless power reception device (e.g., the wireless power reception device 120 of FIG. 1, the wireless power reception device 300 of FIG. 3) or information related to a radio channel formed between the wireless power transmission device 500 and a wireless power reception device (e.g., the wireless power reception device 120 of FIG. 1, the wireless power reception device 300 of FIG. 3). For example, the information related to a rectifier (e.g., the rectifier 340 of FIG. 3) may include at least any one of rectification performance information or rectification range information. The information related to a radio channel may include information on the state of the radio channel. For example, the attribute information may further include information on the location of each wireless power reception device (e.g., the wireless power reception device 120 of FIG. 1, the wireless power reception device 300 of FIG. 3).

The processor 550 may control an overall operation of the wireless power transmission device 500. In this case, the processor 550 may perform various functions. To this end, the processor 550 may control the elements of the wireless power transmission device 500. Furthermore, the processor 550 may receive an instruction or data from the elements of the wireless power transmission device 500, and may process the instruction or data.

The processor 550 may share various types of information with wireless power reception devices (e.g., the wireless power reception devices 120 of FIG. 1, the wireless power reception devices 300 of FIG. 3) using the communication unit 510. Furthermore, the processor 550 may determine power to be transmitted to wireless power reception devices (e.g., the wireless power reception devices 120 of FIG. 1, the wireless power reception devices 300 of FIG. 3). In this case, the processor 550 may determine power to be transmitted to each wireless power reception device (e.g., the wireless power reception device 120 of FIG. 1, the wireless power reception device 300 of FIG. 3) based on performance of a rectifier (e.g., the rectifier 340 of FIG. 3) of each wireless power reception device (e.g., the wireless power reception device 120 of FIG. 1, the wireless power reception device 300 of FIG. 3). Furthermore, the processor 550 may wirelessly transmit power to a wireless power reception device (e.g., the wireless power reception device 120 of FIG. 1, the wireless power reception device 300 of FIG. 3) through the power transmitter 530. The processor 550 may transmit power to a wireless power reception device (e.g., the wireless power reception device 120 of FIG. 1, the wireless power reception device 300 of FIG. 3) based on the OFDM scheme. In this case, the processor 550 may transmit power to a wireless power reception device (e.g., the wireless power reception device 120 of FIG. 1, the wireless power reception device 300 of FIG. 3) through energy beamforming.

Figure 8:
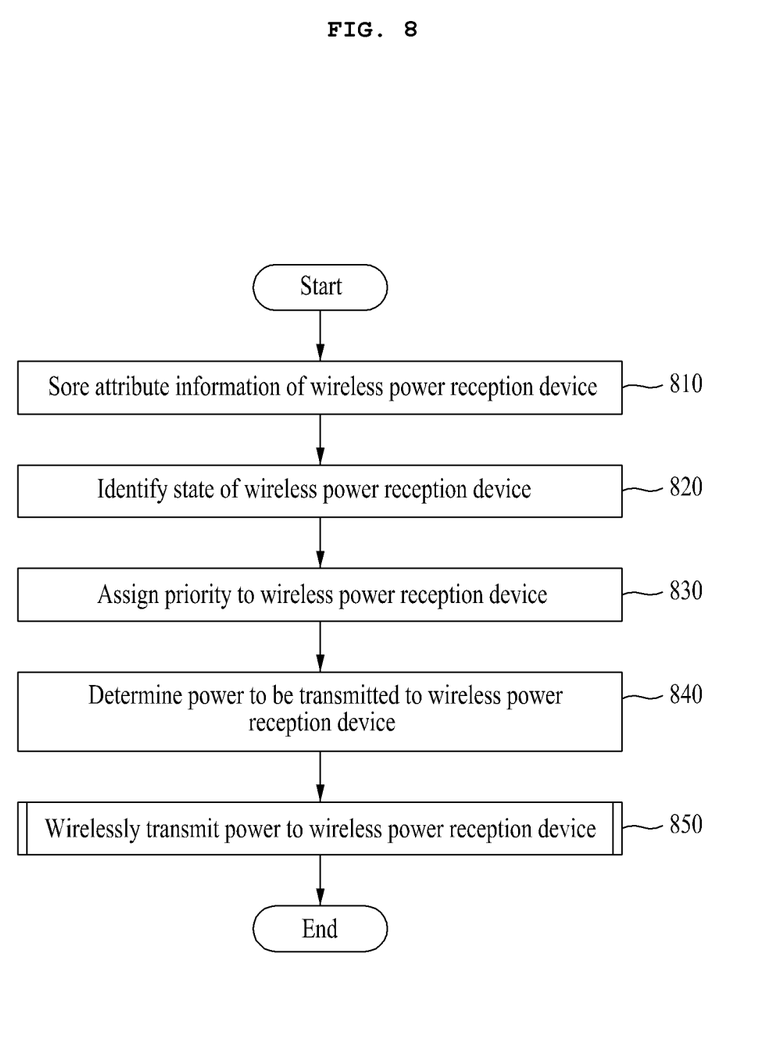
FIG. 8 is a diagram showing a wireless power transmission method according to various embodiments.

FIG. 8 is a diagram showing a wireless power transmission method according to various embodiments.

Referring to FIG. 8, at operation 810, the wireless power transmission device 500 may have stored attribute information of wireless power reception devices (e.g., the wireless power reception devices 120 of FIG. 1, the wireless power reception devices 300 of FIG. 3). The memory 540 may have stored the attribute information of wireless power reception devices (e.g., the wireless power reception devices 120 of FIG. 1, the wireless power reception devices 300 of FIG. 3). To this end, the processor 550 may receive the attribute information from a wireless power reception device (e.g., the wireless power reception device 120 of FIG. 1, the wireless power reception device 300 of FIG. 3) through the communication unit 510, and may store the attribute information in the memory 540. The attribute information may include at least any one of information related to the rectifier (e.g., the rectifier 340 of FIG. 3) of each wireless power reception device (e.g., the wireless power reception device 120 of FIG. 1, the wireless power reception device 300 of FIG. 3) or information related to a radio channel formed between the wireless power transmission device 500 and a wireless power reception device (e.g., the wireless power reception device 120 of FIG. 1, the wireless power reception device 300 of FIG. 3). For example, the information related to the rectifier (e.g., the rectifier 340 of FIG. 3) may include at least any one of rectification performance information or rectification range information. The information related to a radio channel may include information on the state of the radio channel. For example, the attribute information may further include information on the location of each wireless power reception device (e.g., the wireless power reception device 120 of FIG. 1, the wireless power reception device 300 of FIG. 3).

At operation 820, the wireless power transmission device 500 may identify the state of wireless power reception devices (e.g., the wireless power reception devices 120 of FIG. 1, the wireless power reception devices 300 of FIG. 3). In this case, the processor 550 may identify the state of wireless power reception devices (e.g., the wireless power reception devices 120 of FIG. 1, the wireless power reception devices 300 of FIG. 3) through the communication unit 510. To this end, the processor 550 may receive information related to the state of wireless power reception devices (e.g., the wireless power reception devices 120 of FIG. 1, the wireless power reception devices 300 of FIG. 3) through the communication unit 510. The information related to the state of a wireless power reception device (e.g., the wireless power reception device 120 of FIG. 1, the wireless power reception device 300 of FIG. 3) may include at least any one of information on the charging state of a wireless power reception device (e.g., the wireless power reception device 120 of FIG. 1, the wireless power reception device 300 of FIG. 3) or information related to a radio channel formed between the wireless power transmission device 500 and a wireless power reception device (e.g., the wireless power reception device 120 of FIG. 1, the wireless power reception device 300 of FIG. 3). For example, the information on the charging state of a wireless power reception device (e.g., the wireless power reception device 120 of FIG. 1, the wireless power reception device 300 of FIG. 3) may include the amount of remaining battery power. The information related to a radio channel may include information on the state of the radio channel.

At operation 830, the wireless power transmission device 500 may assign priority to wireless power reception devices (e.g., the wireless power reception devices 120 of FIG. 1, the wireless power reception devices 300 of FIG. 3). In this case, the processor 550 may assign priority to wireless power reception devices (e.g., the wireless power reception devices 120 of FIG. 1, the wireless power reception devices 300 of FIG. 3) based on the state of the wireless power reception devices (e.g., the wireless power reception devices 120 of FIG. 1, the wireless power reception devices 300 of FIG. 3). In this case, the processor 550 may assign higher priority to a wireless power reception device (e.g., the wireless power reception device 120 of FIG. 1, the wireless power reception device 300 of FIG. 3) having a smaller amount of remaining battery power.

At operation 840, the wireless power transmission device 500 may determine power to be transmitted to wireless power reception devices (e.g., the wireless power reception devices 120 of FIG. 1, the wireless power reception devices 300 of FIG. 3). In this case, the processor 550 may determine power to be transmitted to each wireless power reception device (e.g., the wireless power reception device 120 of FIG. 1, the wireless power reception device 300 of FIG. 3) based on performance of the rectifier (e.g., the rectifier 340 of FIG. 3) of each wireless power reception device (e.g., the wireless power reception device 120 of FIG. 1, the wireless power reception device 300 of FIG. 3). In this case, the processor 550 may determine power to be transmitted to each wireless power reception device (e.g., the wireless power reception device 120 of FIG. 1, the wireless power reception device 300 of FIG. 3) based on a value for enabling power, output by the rectifier (e.g., the rectifier 340 of FIG. 3) of each wireless power reception device (e.g., the wireless power reception device 120 of FIG. 1, the wireless power reception device 300 of FIG. 3), to reach a predetermined maximum value.

According to an embodiment, the processor 550 may determine power to be transmitted to each wireless power reception device (e.g., the wireless power reception device 120 of FIG. 1, the wireless power reception device 300 of FIG. 3) based on performance of a rectifier (e.g., the rectifier 340 of FIG. 3), a frame size, restriction power assigned to each frequency, or the power restriction condition of the wireless power transmission device 500 with respect to each wireless power reception device (e.g., the wireless power reception device 120 of FIG. 1, the wireless power reception device 300 of FIG. 3). For example, the processor 550 may determine power to be transmitted to each wireless power reception device (e.g., the wireless power reception device 120 of FIG. 1, the wireless power reception device 300 of FIG. 3) based on an optimization algorithm, such as Equation 4. The optimization algorithm may be an algorithm for maximizing a total sum of power obtained from all wireless power reception devices (e.g., the wireless power reception devices 120 of FIG. 1, the wireless power reception devices 300 of FIG. 3). Furthermore the processor 550 may determine an actual solution ($P^*_{t,k}$) for the optimization algorithm as power to be transmitted to each wireless power reception device (e.g., the wireless power reception device 120 of FIG. 1, the wireless power reception device 300 of FIG. 3) based on a waterfilling algorithm, such as Equation 5.

$$\max_{p_t} \sum_{k \in \Pi} r(p_{t,k}) = \sum_{k \in \Pi} a_k \log(1 + b_k \lambda_k p_{t,k})$$ [Equationi 4]

$$\text{s.t. } 0 \leq p_{t,k} \leq \min\left(P_c, \frac{c_k}{\lambda_k}\right) \quad \forall k \in \tilde{C},$$

$$\sum_{k=1}^{N} p_{t,k} \leq E_r \quad \forall k \in \tilde{C}.$$

In this case, may indicate power to be transmitted from the wireless power transmission device 500 to a k-th wireless power reception device (e.g., the wireless power reception device 120 of FIG. 1, the wireless power reception device 300 of FIG. 3). $r(p_{t,k})$ may indicate power substantially obtained from $p_{t,k}$ by the k-th wireless power reception device. $a_k$ and $b_k$ may indicate variables of a proximate function according to performance of the rectifier (e.g., the rectifier 340 of FIG. 3) of the k-th wireless power reception device (e.g., the wireless power reception device 120 of FIG. 1, the wireless power reception device 300 of FIG. 3). $\lambda_k$ may indicate a maximum Eigen value of a channel matrix $h_k h_k^H$ for the k-th wireless power reception device (e.g., the wireless power reception device 120 of FIG. 1, the wireless power reception device 300 of FIG. 3). $c_k$ may indicate power according to maximum performance of the rectifier. $E_r$ may indicate maximum power that may be transmitted by the wireless power transmission device 500. N may indicate the number of wireless power reception devices (e.g., the wireless power reception devices 120 of FIG. 1, the wireless power reception devices 300 of FIG. 3). $\tilde{C}$ may indicate a set of wireless power reception devices (e.g., the wireless power reception devices 120 of FIG. 1, the wireless power reception devices 300 of FIG. 3).

$$p_{t,k}^* = \begin{cases} ha_k - \frac{1}{b_k \lambda_k}, & \text{if this is } > 0 \text{ or } < \min\left(P_c, \frac{c_k}{\lambda_k}\right) \\ \min\left(P_c, \frac{c_k}{\lambda_k}\right), & \text{if the above value is } \geq \min\left(P_c, \frac{c_k}{\lambda_k}\right) \\ 0, & \text{Otherwise} \end{cases}$$ [Equation 5]

At operation 850, the wireless power transmission device 500 may wirelessly transmit power to the wireless power reception devices (e.g., the wireless power reception devices 120 of FIG. 1, the wireless power reception devices 300 of FIG. 3). In this case, the processor 550 may transmit power to the wireless power reception devices (e.g., the wireless power reception devices 120 of FIG. 1, the wireless power reception devices 300 of FIG. 3) through the power transmitter 530. The processor 550 may transmit power to the wireless power reception devices (e.g., the wireless power reception devices 120 of FIG. 1, the wireless power reception devices 300 of FIG. 3) based on the OFDM scheme. The processor 550 may transmit power to the wireless power reception devices (e.g., the wireless power reception devices 120 of FIG. 1, the wireless power reception devices 300 of FIG. 3) based on the priority assigned to the wireless power reception devices (e.g., the wireless power reception devices 120 of FIG. 1, the wireless power reception devices 300 of FIG. 3). For example, the processor 550 may transmit power to the wireless power reception devices (e.g., the wireless power reception devices 120 of FIG. 1, the wireless power reception devices 300 of FIG. 3) in order from higher priority to lower priority.

Figure 9:
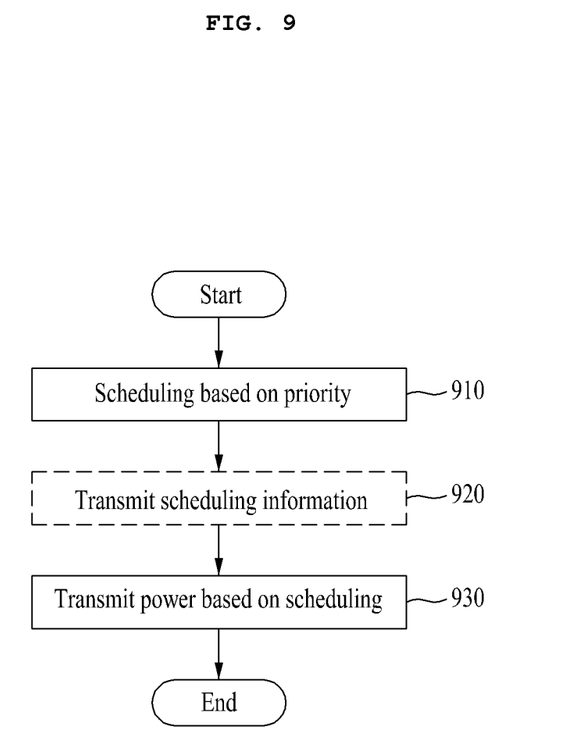
FIG. 9 is a diagram showing a power transmission operation FIG. 8.

FIG. 9 is a diagram showing the power transmission operation FIG. 8.

Referring to FIG. 9, at operation 910, the wireless power transmission device 500 may perform scheduling on wireless power reception devices (e.g., the wireless power reception devices 120 of FIG. 1, the wireless power reception devices 300 of FIG. 3) based on priority. In this case, the processor 550 may allocate frames to the wireless power reception devices (e.g., the wireless power reception devices 120 of FIG. 1, the wireless power reception devices 300 of FIG. 3), respectively, based on the priority of the wireless power reception devices (e.g., the wireless power reception devices 120 of FIG. 1, the wireless power reception devices 300 of FIG. 3). For example, the processor 550 may sequentially allocate the first frame to the last frame to the wireless power reception devices (e.g., the wireless power reception devices 120 of FIG. 1, the wireless power reception devices 300 of FIG. 3) in order from higher priority to lower priority. Accordingly, the processor 550 may generate scheduling information as a result of the execution of the scheduling.

At operation 920, the wireless power transmission device 500 may transmit the scheduling information to the wireless power reception devices (e.g., the wireless power reception devices 120 of FIG. 1, the wireless power reception devices 300 of FIG. 3). In this case, the processor 550 may transmit the scheduling information to the wireless power reception devices (e.g., the wireless power reception devices 120 of FIG. 1, the wireless power reception devices 300 of FIG. 3) through the communication unit 510. In an embodiment, the wireless power transmission device 500 may not perform operation 920. That is, the wireless power transmission device 500 may not share the scheduling information with the wireless power reception devices (e.g., the wireless power reception devices 120 of FIG. 1, the wireless power reception devices 300 of FIG. 3).

At operation 930, the wireless power transmission device 500 may transmit power to the wireless power reception devices (e.g., the wireless power reception devices 120 of FIG. 1, the wireless power reception devices 300 of FIG. 3) based on the scheduling. In this case, the processor 550 may transmit power to each wireless power reception device (e.g., the wireless power reception device 120 of FIG. 1, the wireless power reception device 300 of FIG. 3) through a frame allocated to each wireless power reception device (e.g., the wireless power reception device 120 of FIG. 1, the wireless power reception device 300 of FIG. 3).

Furthermore, the processor 550 may transmit power to each wireless power reception device (e.g., the wireless power reception device 120 of FIG. 1, the wireless power reception device 300 of FIG. 3) through energy beamforming facing the wireless power reception device (e.g., the wireless power reception device 120 of FIG. 1, the wireless power reception device 300 of FIG. 3) in each frame. In this case, the processor 550 may form a beam (e.g., the beam 130 of FIG. 1) having directivity facing each wireless power reception device (e.g., the wireless power reception device 120 of FIG. 1, the wireless power reception device 300 of FIG. 3) using the antennas of the power transmitter 530. To this end, the processor 550 may form the beam (e.g., the beam 130 of FIG. 1) for transmitting power to the wireless power reception device (e.g., the wireless power reception device 120 of FIG. 1, the wireless power reception device 300 of FIG. 3) using a weight vector ($w_k$) determined based on a radio channel formed between the wireless power transmission device 500 and the wireless power reception device (e.g., the wireless power reception device 120 of FIG. 1, the wireless power reception device 300 of FIG. 3).

Accordingly, each of the wireless power reception devices (e.g., the wireless power reception devices 120 of FIG. 1, the wireless power reception devices 300 of FIG. 3) may receive power through each frame allocated thereto. In this case, each wireless power reception devices (e.g., the wireless power reception device 120 of FIG. 1, the wireless power reception device 300 of FIG. 3) may receive power from a beam (e.g., the beam 130 of FIG. 1) formed to face the wireless power reception device (e.g., the wireless power reception device 120 of FIG. 1, the wireless power reception device 300 of FIG. 3) by the wireless power transmission device 500 through at least one antenna.

According to various embodiments, the wireless power transmission device (e.g., the wireless power transmission device 110 of FIG. 1, the wireless power transmission device 500 of FIG. 5) transmits power in the form of electromagnetic waves, so the range that power is reached from a wireless power transmission device (e.g., the wireless power transmission device 110 of FIG. 1, the wireless power transmission device 500 of FIG. 5) can be expanded. Accordingly, although a wireless power reception device (e.g., the wireless power reception device 120 of FIG. 1, the wireless power reception device 300 of FIG. 3) is positioned at a remote distance, for example, several tens of meter (m) or more from a wireless power transmission device (e.g., the wireless power transmission device 110 of FIG. 1, the wireless power transmission device 500 of FIG. 5), it may be charged with power by receiving electromagnetic waves from the wireless power transmission device (e.g., the wireless power transmission device 110 of FIG. 1, the wireless power transmission device 500 of FIG. 5). Accordingly, the wireless power transmission device (e.g., the wireless power transmission device 110 of FIG. 1, the wireless power transmission device 500 of FIG. 5) can charge the wireless power reception device (e.g., the wireless power reception device 120 of FIG. 1, the wireless power reception device 300 of FIG. 3) more efficiently.

According to various embodiments, the range that power is reached from the wireless power transmission device can be expanded because the wireless power transmission device transmits power in the form of electromagnetic waves. Accordingly, although a wireless power reception device is positioned at a remote distance, for example, several tens of meters (m) from the wireless power transmission device, it can be charged with power by receiving the electromagnetic waves from the wireless power transmission device. Accordingly, the wireless power transmission device can charge the wireless power reception device more effectively.

Although various embodiments of this document have been described, this disclosure may be modified in various ways without departing from the scope of the various embodiments of the disclosure. Accordingly, the scope of the various embodiments of this document should not be limited to the above-described embodiments, but should be defined by not only the claims, but equivalents thereof.

What is claimed is:

1. A method for a wireless power transmission device to transmit power wirelessly, the method comprising:
   receiving, from each of a plurality of wireless power reception devices, attribute information of said each of the plurality of wireless power reception devices, the attribute information including: i) rectification performance information and rectification range information of a rectifier of said each of the plurality of wireless power reception devices, ii) information of state on a radio channel between the wireless power transmission device and said each of the plurality of wireless power reception devices, and iii) information on location of said each of the plurality of wireless power reception devices;
   identifying rectifier performance of said each of the plurality of wireless power reception devices based on the received attribute information;
   determining power to be transmitted to said each of the plurality of wireless power reception devices based on the identified rectifier performance;
   transmitting power to said each of the plurality of wireless power reception devices in an electromagnetic wave form;
   identifying a charging state of said each of the plurality of wireless power reception devices; and
   assigning priority to said each of the plurality of wireless power reception devices based on the charging state;
   wherein the transmitting the power comprises:
      defining a plurality of super frames contiguous in a time domain, each of the plurality of super frames including a plurality of temporally divided frames;
      performing scheduling of said each of the plurality of super frames to allocate at least some of the frames included in the plurality of super frames to said each of the plurality of wireless power reception devices; and
      transmitting the power to said each of the plurality of wireless power reception devices through the allocated frames; and
   wherein the performing the scheduling comprises performing the scheduling of said each of the plurality of super frames based on the assigned priority of said each of the plurality of wireless power reception devices.

2. The method of claim 1, wherein the determining the power comprises:
   determining the power based on a value enabling the power, output by a rectifier, to reach a predetermined maximum value.

3. The method of claim 1, wherein the transmitting the power comprises:
   forming a beam for transmitting the power to one of the plurality of wireless power reception devices using a weight vector that is determined based on a radio channel between the wireless power transmission device and said one of the plurality of wireless power reception devices.

4. The method of claim 1, wherein each of the plurality of wireless power reception devices comprises an Internet of things (IOT) sensor.

5. A wireless power transmission device, comprising:
   a power transmitter having a plurality of antennas;
   a processor connected to the power transmitter; and
   a communication unit configured to communicate with a plurality of wireless power reception devices;
   wherein the processor is configured to:
      receive, from each of the plurality of wireless power reception devices, attribute information of said each of the plurality of wireless power reception devices through the communication unit, the attribute information including: i) rectification performance information and rectification range information of a rectifier of said each of the plurality of wireless power reception devices, ii) information of state on a radio channel between the wireless power transmission device and said each of the plurality of wireless power reception devices, and iii) information on location of said each of the plurality of wireless power reception devices;

identify rectifier performance of said each of the plurality of wireless power reception devices based on the received attribute information;

determine power to be transmitted to said each of the plurality of wireless power reception devices based on the identified rectifier performance; and control the power transmitter to transmit the power to said each of the plurality of wireless power reception devices in an electromagnetic wave form through the antennas;

define a plurality of super frames contiguous in a time domain, each of the plurality of super frames including a plurality of temporally divided frames;

perform scheduling of said each of the plurality of super frames to allocate at least some of the frames included in the plurality of super frames to said each of the plurality of wireless power reception devices;

transmit the power to said each of the plurality of wireless power reception devices through the allocated frames;

identify a charging state of said each of the plurality of wireless power reception devices through the communication unit;

assign priority to said each of the plurality of wireless power reception devices based on the charging state; and perform the scheduling of said each of the plurality of super frames based on the assigned priority of said each of the plurality of wireless power reception devices.

6. The wireless power transmission device of claim 5, wherein the processor is further configured to: determine the power based on a value enabling the power, output by a rectifier, to reach a predetermined maximum value.

7. The wireless power transmission device of claim 5, wherein the processor is further configured to:

form a beam for transmitting the power to one of the plurality of wireless power reception devices using a weight vector that is determined based on a radio channel between the wireless power transmission device and said one of the plurality of wireless power reception devices.

8. The wireless power transmission device of claim 5, wherein each of the plurality of wireless power reception devices comprises an Internet of things (IOT) sensor.

\* \* \* \* \*